(12) United States Patent
Shiu et al.

(10) Patent No.: US 8,157,231 B2
(45) Date of Patent: Apr. 17, 2012

(54) POSITIONING APPARATUS

(75) Inventors: Chiuan-Che Shiu, Taoyuan (TW);
Chih-chiang Lee, Taoyuan (TW);
Kuo-Chang Teng, Taoyuan (TW)

(73) Assignee: Chunghwa Picture Tubes, Ltd.,
Taoyuan (TW)

( * ) Notice: Subject to any disclaimer, the term of this patent is extended or adjusted under 35 U.S.C. 154(b) by 1472 days.

(21) Appl. No.: 11/702,650

(22) Filed: Feb. 6, 2007

(65) Prior Publication Data

US 2008/0087702 A1 Apr. 17, 2008

(30) Foreign Application Priority Data

Oct. 11, 2006 (TW) .............................. 95137355 A

(51) Int. Cl.
*A47H 1/14* (2006.01)
(52) U.S. Cl. .................. 248/251; 248/346.06; 226/177; 226/194; 242/598.5
(58) Field of Classification Search .................... 226/18, 226/174, 176; 248/251, 265, 267, 346.06
See application file for complete search history.

(56) References Cited

U.S. PATENT DOCUMENTS

| | | | | |
|---|---|---|---|---|
| 5,131,616 A * | 7/1992 | Biba | ............................. | 248/265 |
| 6,196,508 B1 * | 3/2001 | Nijs | ............................. | 248/267 |
| 2002/0179668 A1 * | 12/2002 | Hargrave et al. | .................. | 225/4 |
| 2005/0183835 A1 * | 8/2005 | Nien | ............................. | 160/321 |
| 2006/0065096 A1 * | 3/2006 | Liu | ............................. | 83/651 |
| 2007/0120031 A1 * | 5/2007 | Rasmussen | .................... | 248/266 |
| 2007/0170626 A1 * | 7/2007 | Shiu et al. | ........................ | 269/21 |

FOREIGN PATENT DOCUMENTS

TW 346028 U1 * 11/1998
TW 346028 U * 12/2008

* cited by examiner

*Primary Examiner* — Terrell McKinnon
*Assistant Examiner* — Daniel J Breslin
(74) *Attorney, Agent, or Firm* — Jianq Chyun IP Office

(57) ABSTRACT

Positioning apparatus applied on equipment with one or a plurality of single axles is fixed on two bases opposite to each other. Adjusting device is located in each base and corresponding to each cross or single axle, which is configured for adjusting the position of the cross or single axle in a direction parallel to the base. Fixing device is configured for fixing the adjusting device on the base. The fixing device is moved in one direction vertical to the adjusting device adjusted in another direction.

17 Claims, 6 Drawing Sheets

POSITIONING APPARATUS

BACKGROUND OF THE INVENTION

1. Field of the Invention

The present invention relates to positioning apparatus, and more especially, to positioning apparatus applied to a polarizer split-off machine.

2. Background of the Related Art

Shown in FIG. 1A, a polarizer split-off machine 100 have a roll get axle 112, a destaticizer 114 and a press wheel axle 116 parallel to each another and fixed on a base 110. Generally, the roll get axle 112 and the press wheel axle 116 has individual adjusting mechanism, but the destaticizer 114 rotates along its central line. Furthermore, when a split-off polarizer is left after a board (not shown) through the roll get axle 112, destaticizer 114 and press wheel axle 116, it would be pulled out with pressing a switch 111 by a user.

Depicted on FIG. 1B, press wheel axle 116, for example, some adjusting bolts 120 and a fixing bolt 122 are located at the ends of the press wheel axle 116 and fixed on the base 110 with a board 124. During adjustment, the distance between the adjusting bolts 120 and the board 124 is adjusted for adjusting the height of the press wheel axle 116. After adjustment, the fixing bolt 122 is fastened onto the board 124. Accordingly, the board 124 is a reference for adjustment and fixing process.

However, the adjusting height aforementioned will be changed by the fixing process, which reduces the accuracy of adjustment. Next, various types of bolts and nuts used in a conventional machine may be performed by various tools, which complicates the operations for adjusting and fixing these axles, especially when the machine is set in a clean room. Furthermore, it is disadvantageous that the height of a traditional destaticizer would not be adjusted. Next, the user needs to pull the split-off polarizer out with one hand and press the switch with the other hand, which will annoy the user when the dimension of a polarizer increases.

SUMMARY OF THE INVENTION

In order to solve the problems mentioned above, one object of the present invention provides positioning apparatus for a cross or single axle. An adjustment device is configured in a direction parallel to a base for adjusting the cross or single axle, while a fixing device imposed force on the adjustment device in a forcing direction vertical to the adjustment device does, so as to make the independency of the adjustment and fixing processes.

Another object of the present invention provides positioning apparatus applied to a machine with one or more cross or single axles. There are same or similar assemblies used in various axles and corresponding to a measuring device, so as to simply the tools in use and improve the accuracy of adjustment.

Accordingly, one embodiment of the present invention provides positioning apparatus. Two bases are opposite to each other. Each base has at least one cavity. An adjusting chunk is movably positioned in the cavity and with a plurality of slots and a loading device distributed configured for loading a cross or a single axle. A fixing device is correspondingly constrained within any one of the slots and fixed in the cavity through the corresponding slot.

DETAILED DESCRIPTION OF THE INVENTION

Figure 1A:
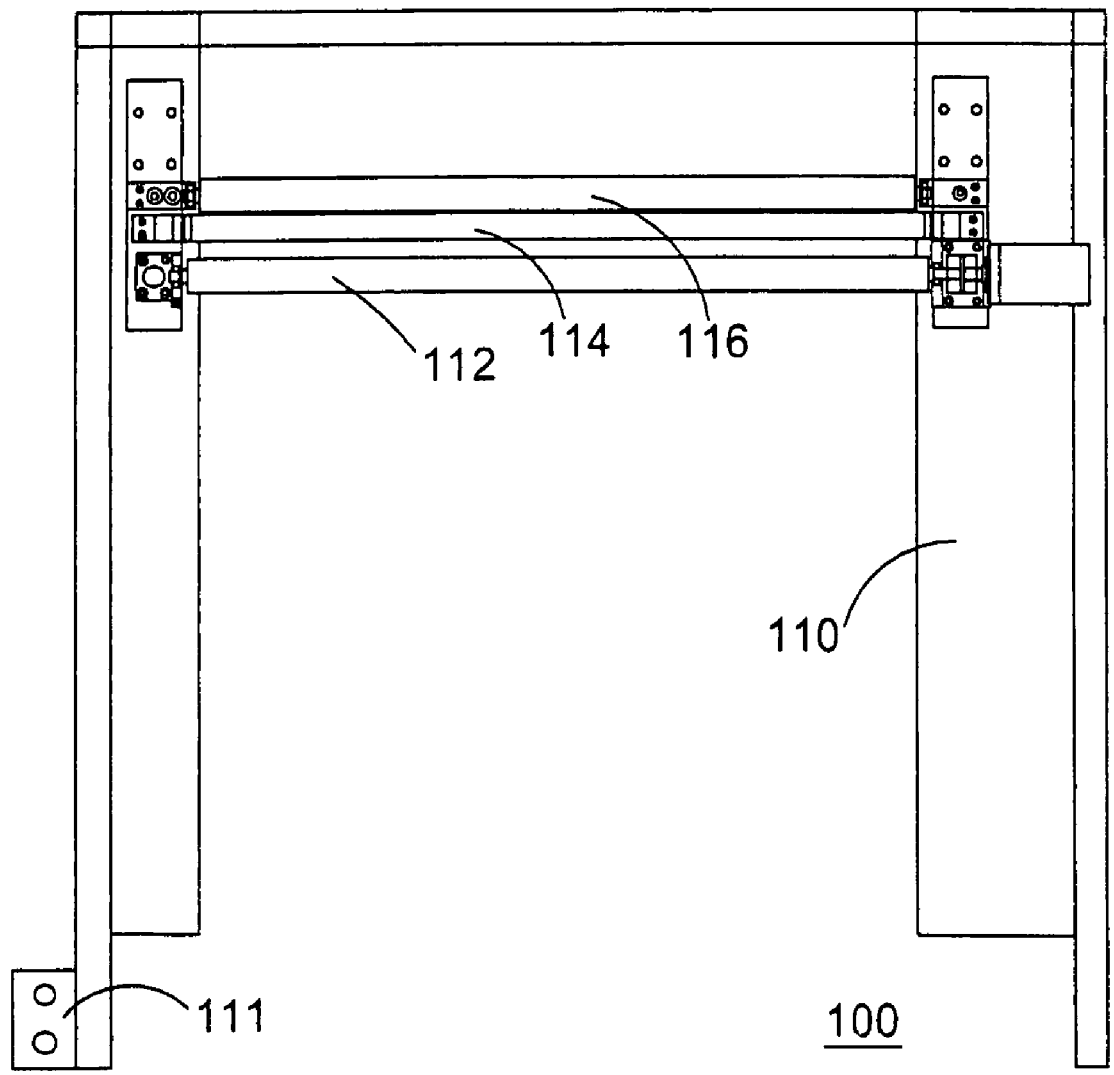
FIG. 1A is a schematically perspective front-view diagram illustrating a polarizer split-off machine in accordance with the prior art.
Figure 1B:
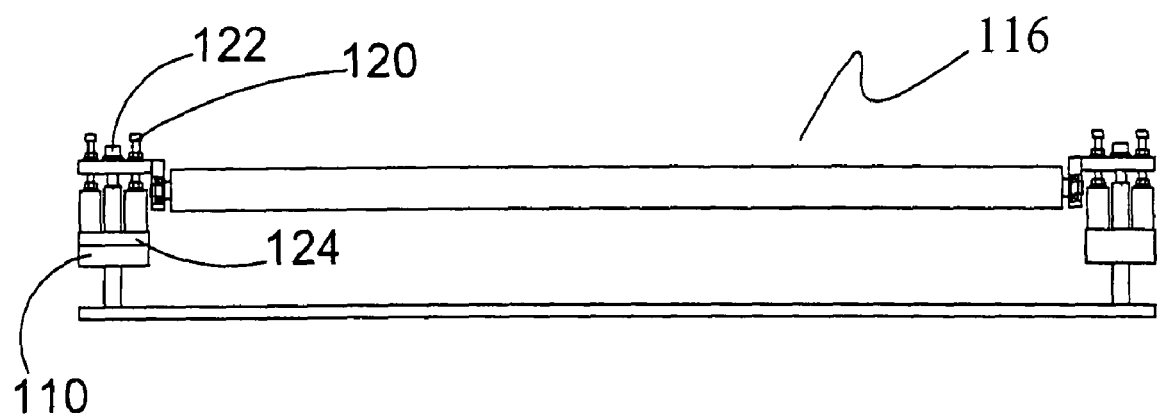
FIG. 1B is a schematically perspective side-view diagram illustrating a press wheel axle in accordance with the prior art.
Figure 2:
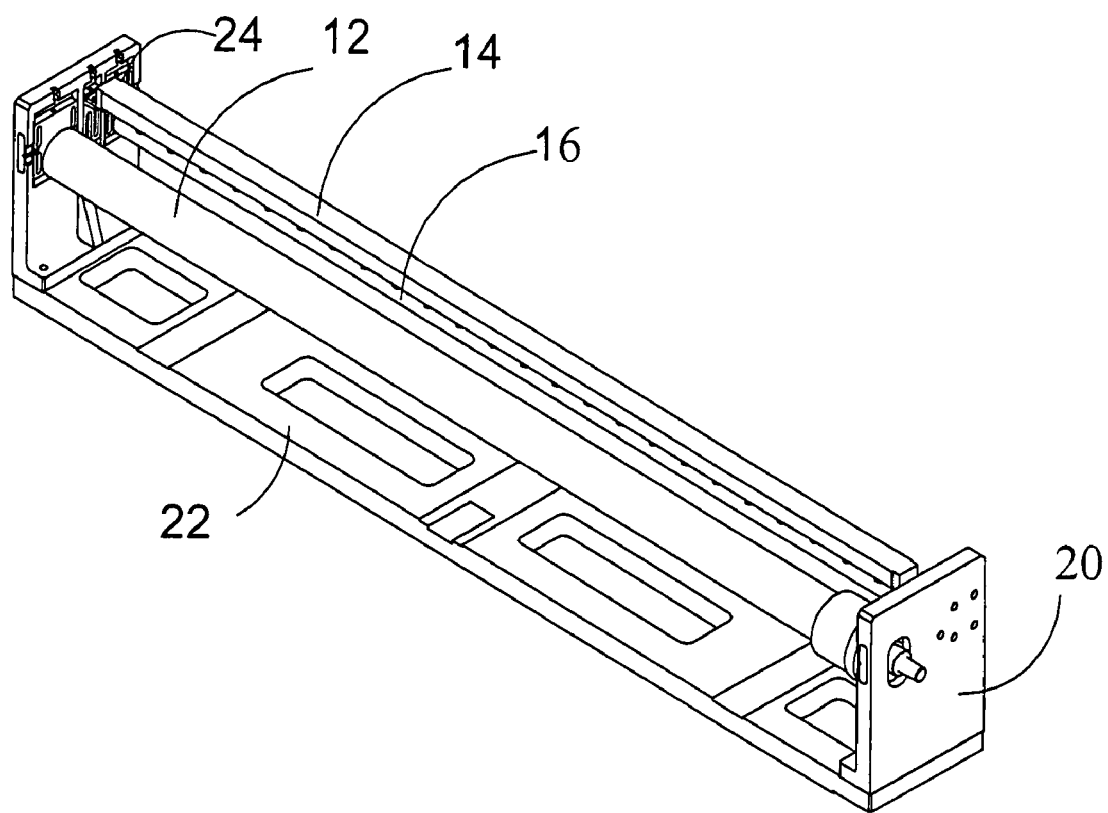
FIG. 2 is a schematically three-dimensional side-view diagram illustrating a positioning apparatus in combination of one or more cross or single axles of an embodiment of the invention in accordance with the present invention.

FIG. 2 illustrates the position of positioning apparatus in combination of cross or single axles 12, 14 and 16. In one embodiment, such as application of a polarizer split-off machine, the positioning apparatus includes a base 20 and multitudes of adjusting chunk 24 fixed on the base 20. The base 20 may be fixed on a plate 22 or other frames (not shown) for the polarizer split-off machine. The cross or single axles 12, 14 and 16 are corresponding to and fixed onto the adjusting chunks 24, respectively. It is noted that, in the embodiment, the position relationship of cross or single axles 12, 14 and 16 is not limited to the one shown in the drawing, dependent on the application to the polarizer split-off machine. Next, the cross or single axles 12, 14 or 16 may be a roll get axle, a destaticizer or a press wheel axle. Furthermore, the cross or single axles 12, 14 or 16 may be movable or rigid cross/single axles. Alternatively, the apparatus of the present invention is also applied to one of the cross or single axles 12, 14 and 16 without the limitation on the number of axles.

Figure 3:
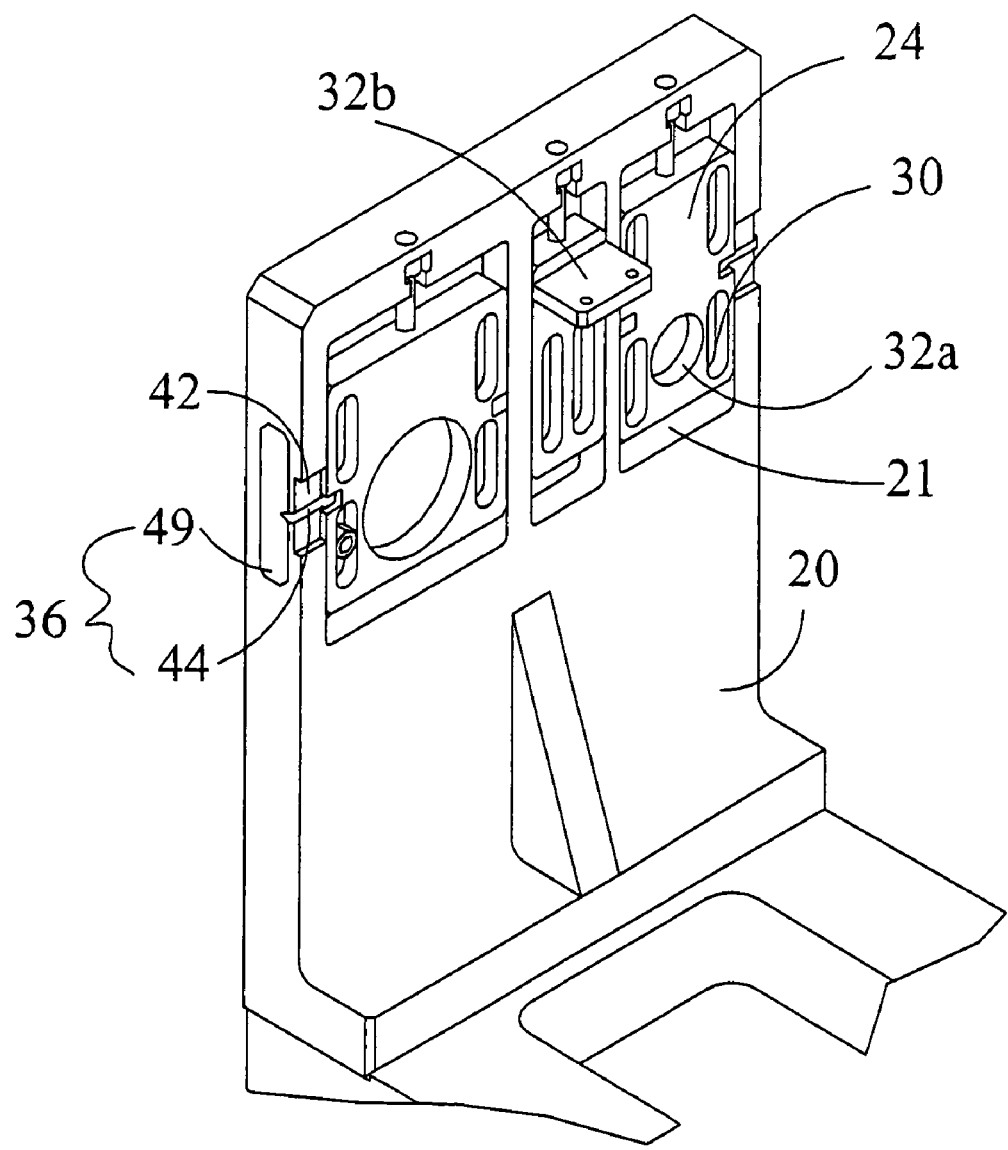
FIG. 3 is a schematically three-dimensional side-view diagram illustrating a positioning apparatus of an embodiment of the invention in accordance with the present invention.

Shown in FIG. 3, a loading portion 32a or 32b and multitudes of slots 30 are configured to the each adjusting chunk 24. There are adjusters positioned in the base 20 and attached the adjusting chunk 24, which is configured to adjust the position of the adjusting chunk 24 on the base 20. Furthermore, a measuring device 36 is suitably positioned on the base 20 to present the position of the adjusting chunk 24.

In one embodiment, the each adjusting chunk 24 is positioned in the cavity 21 of the base 20. The cavity 21 in a dimension larger than the adjusting chunk 24 may provide the adjusting chunk 24 with the suitable space for adjusting. In the embodiment, the cavity 21, such as a sliding way, provides the suitable space to the adjusting chunk 24 to adjust the height of the adjusting chunk 24 in the sliding way. Next, the slot 30, as slot in a bar shape to position a fixing device onto the base 20. Furthermore, the loading portion 32a and 32b are used to load and fix the cross or single axles 12, 14 and 16 and one of them aforementioned and dependent on the design requirement. For a turning axle, the loading portion 32a may be a trench in a specific shape to position one end of the cross or single axle 12, 14 or 16. For a rigid axle, the loading portion 32b may be a fixing board extruded out of the adjusting chunk 24 to engage the cross or single axle 12, 14 or 16 with the bolts.

Furthermore, a measuring device 36 includes an arm 44 and a scale 49. The arm 44 has one end fixed on the adjusting chunk 24 through a channel 42 of the base 20, and the other end with a pointer exposed to the sidewall of the base 20. The scale 49 may be set on the exposed side of the measuring device 36 to present the height of the adjusting chunk 24. The amount of the measuring devices 36 is not limited in the embodiment, such as ones set for the adjusting chunk 24 at both exposed sides of the base 20.

Figure 4A:
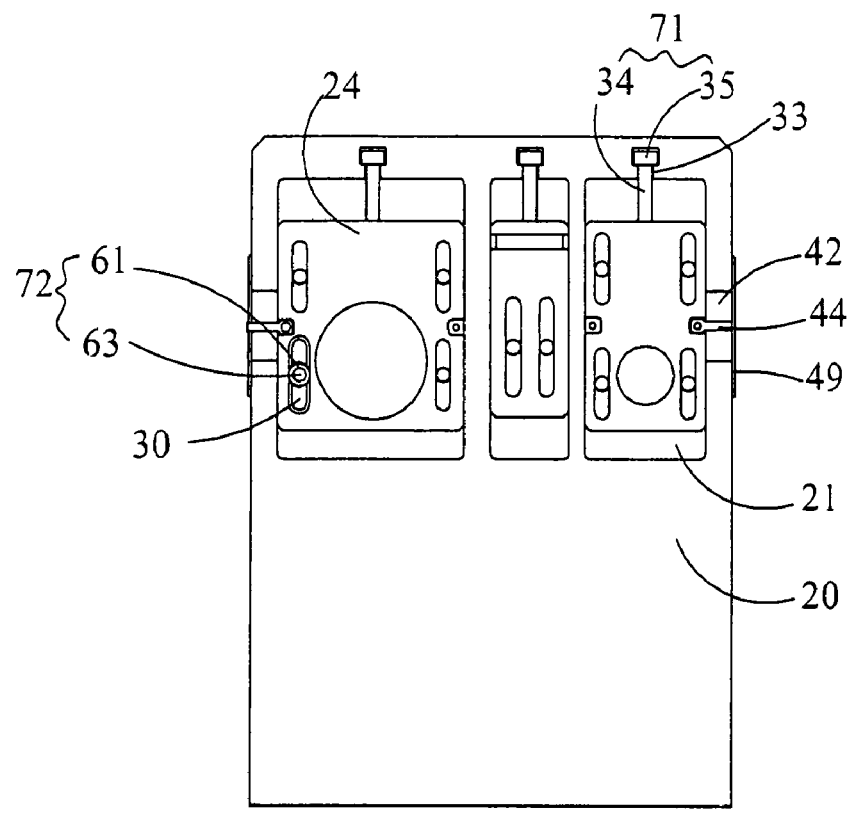
FIG. 4A is a schematically a cross-sectional diagram illustrating a positioning apparatus of an embodiment of the invention in accordance with the present invention.

Shown in FIG. 4A, an adjuster 71 includes a height-adjusting bolt 34 and a nut 35, which is capable of self-rotating or rotating at right position in a screwed hole 33 right atop the base 20. One end of the adjuster 71 may be attached to the side of the adjusting chunk 24, and the other end may be exposed to outside of the base 20 or embedded into the screwed hole 33 of the base 20. Next, one or more assemblies 72 of fixing bolt 61 and nut 63 may be set on each slot 30 and fixed onto the base 20 through the corresponding slot 30.

Accordingly, one feature of the present invention is the independently individual processes of fixing and adjusting the cross or single axle 12, 14 and 16. As soon as unfastened the assembly 72 of fixing bolt 61 and nut 63, the adjusting chunk 24 may be freely sliding in the cavity 21 and have a vertical location adjusted by the adjuster 71, so that the vertical height of the cross or single axle 12, 14 or 16 is determined. Once the height of the adjusting chunk 24 is determined, the assembly 72 of fixing bolt 61 and nut 63 may be fastened to fix the adjusting chunk 24. The fastening process on the assembly 72 of fixing bolt 61 and nut 63 is in a direction different from the adjusting process, which does not have influences upon the height determined by the adjusting chunk 24.

Next, one feature of the present invention is to provide the pointer associated with the scale 49 to present the height of the adjusting chunk 24. Thus, an operator may definitely know the height of the adjusting chunk 24.

Figure 4B:
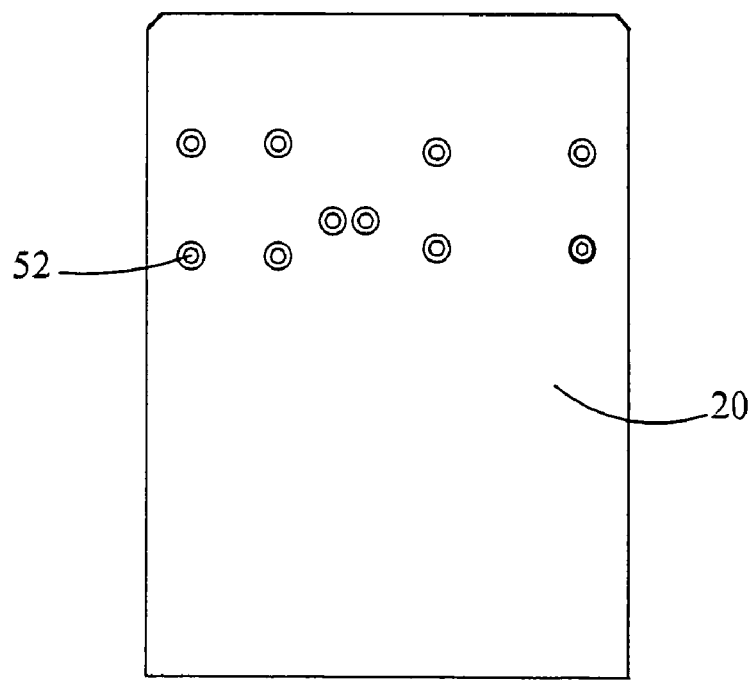
FIG. 4B is a schematically a backside-view diagram illustrating a base in a positioning apparatus of an embodiment of the invention in accordance with the present invention.

FIG. 4B illustrates the backside of the base 20. In one embodiment, there are only nuts 52, corresponding to the assembly of fixing bolt and nut, embedded into the backside of the base 20, which do not have adverse influences on aesthetic aspects.

Figure 5:
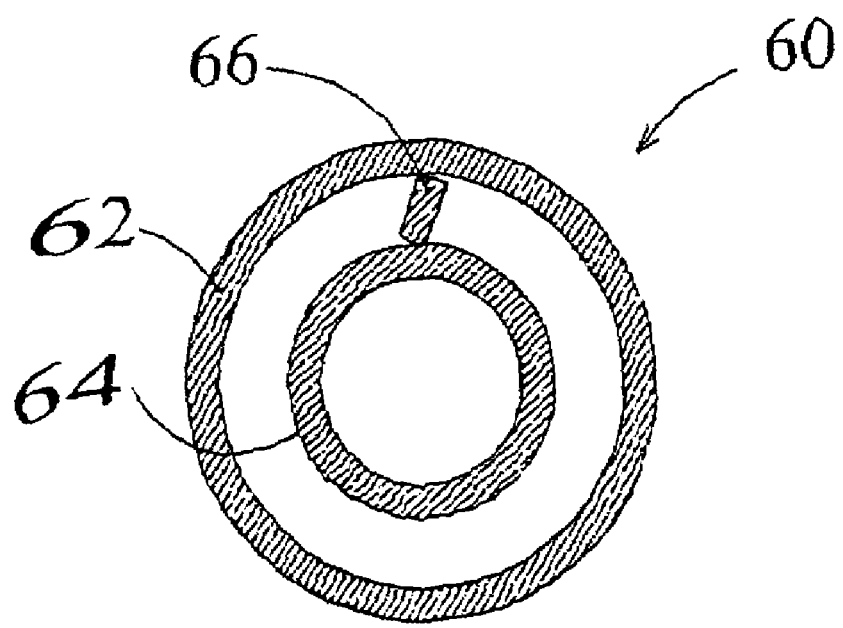
FIG. 5 is a cross-sectional diagram illustrating a roll get axle plus one-way bearing of an embodiment of the invention in accordance with the present invention.

Furthermore, shown in FIG. 5 illustrates a cross or single axle with a one-way bearing. In addition of the resolution of adjustment mechanics, the present invention further enhances the operation safety for the apparatus by setting a one-way bearing 60. The one-way bearing 60 includes an outer wheel 62, inner wheel 64 and a barricade 66. In the embodiment, when a user intends pulling a polarizer out of a cross or single axle, his or her hands would not be clipped because of freely inverse turning of the one-way bearing 60.

Accordingly, the adjusting device of the present invention is configured for adjusting a cross or single axle in a direction parallel to the base. On the other hand, the fixing device is configured for fixing the adjusting device, which acts in a forcing direction vertical to the one aforementioned for sure that the adjusted height is accurate. Next, the same or similar bolts and nuts are used in both the adjusting and the fixing devices, which simplify the tools in use. Furthermore, the measuring device associated with the adjusting device may definitely present the adjusted location, which improves the accuracy of adjustment.

Accordingly, one embodiment provides positioning apparatus applied on equipment with a plurality of cross or single axles. Adjusting chunk is located in each base and corresponding each cross or single axle, which is configured for adjusting the position of the corresponding cross or single axle in a direction parallel to the corresponding base. Fixing device is corresponding to the adjusting chunk and for fixing the corresponding adjusting chunk on the corresponding base. The fixing device imposes the corresponding adjusting chunk in a forcing direction vertical to the direction afore- mentioned. The adjusting chunk is sliding positioned in the cavity of the corresponding base, which has a plurality of slots and a loading device for loading the corresponding cross or single axle. The adjuster is movably positioned in the corresponding base and attached the adjusting chunk. The adjusting chunk is moved with the sliding of the adjuster while the adjuster is slid in a sliding direction parallel to the direction aforementioned.

Although the present invention has been explained in relation to its preferred embodiment, it is to be understood that other modifications and variation can be made without departing the spirit and scope of the invention as hereafter claimed.

What is claimed is:

1. A positioning apparatus, applied on equipment with a plurality of single axles, the positioning apparatus comprising:
    two bases oppositely positioned in the equipment;
    an adjusting device located in each of the bases and corresponding each the single axle, the adjusting device for adjusting a position of the corresponding single axle in a direction parallel to the corresponding base; and
    a fixing device corresponding to the adjusting device and for fixing the corresponding adjusting device on the corresponding base, wherein a fastening direction of the fixing device is vertical to an adjusting direction of the adjusting device, wherein, the fastening direction is the direction through the base, and the adjusting direction is the direction parallel to the base,
    wherein the adjusting device comprises:
    an adjusting chunk slidingly positioned in a cavity of the corresponding base, the adjusting chunk having a plurality of slots and a loading portion distributed on the adjusting chunk, wherein the loading portion is configured for loading the corresponding single axle; and
    an adjuster movably positioned in the corresponding base and being attached to the adjusting chunk, wherein the adjusting chunk is moved with the sliding of the adjuster while the adjuster is slid in a sliding direction parallel to the direction parallel to the corresponding base, and the sliding direction is the adjusting direction.

2. The positioning apparatus according to claim 1, wherein the fixing device comprises a fixing bolt positioned in any one of the slots, through the corresponding slot, the bolt fixing the adjusting chunk into the cavity.

3. The positioning apparatus according to claim 1, further comprising a measuring device fixed on the adjusting chunk, the measuring device comprising:
    a scale fixed on a sidewall of the corresponding base and located on a channel of the corresponding base; and
    an arm being through the channel, with one end fixed onto the adjusting chunk and the other end cooperated with the scale to present the position of the adjusting chunk.

4. The positioning apparatus according to claim 1, wherein any one of the single axles is a movable axle which has a one-way bearing.

5. The positioning apparatus according to claim 1, wherein any one of the single axles is a rigid cross axle.

6. The positioning apparatus according to claim 1, wherein the adjuster is a height-adjusting bolt.

7. A positioning apparatus, comprising:
    two bases positioned opposite to each other, wherein each of the bases has at least one cavity;
    an adjusting chunk movably positioned in the cavity, the adjusting chunk with a plurality of slots and a loading portion distributed on the adjusting chunk, wherein the loading portion is configured for loading a cross axle;

a fixing device positioned within any one of the slots, wherein the fixing device is fixed in the cavity through one of the slots; and an adjuster in each of the bases for adjusting the height of the adjusting chunk in the cavity, wherein a fastening direction of the fixing device is vertical to an adjusting direction of the adjuster, wherein, the fastening direction is the direction through the base, and the adjusting direction is the direction parallel to the base.

8. The positioning apparatus according to claim 7, wherein the fixing device comprises an assembly of fixing bolt and nut.

9. The positioning apparatus according to claim 7, wherein the cavity is a slide way.

10. The positioning apparatus according to claim 9, wherein the adjusting chunk is a slide chunk.

11. The positioning apparatus according to claim 7, wherein the adjuster comprises an assembly of height-adjusting bolt and nut.

12. The positioning apparatus according to claim 11, wherein the base further comprises a screwed hole to position the height-adjusting bolt and nut.

13. The positioning apparatus according to claim 7, further comprising a measuring device fixed on the adjusting chunk.

14. The positioning apparatus according to claim 13, wherein each of the bases further comprises a channel corresponding to the measuring device to allow the measuring device to pass through and be exposed outside of the base.

15. The positioning apparatus according to claim 14, wherein the measuring device comprises:

a scale fixed on a sidewall of the base and on the channel; and an arm through the channel, with an end fixed on the adjusting chunk and the other end cooperated with the scale to present a position of the adjusting chunk.

16. The positioning apparatus according to claim 7, wherein the loading portion comprises a trench engaged with the cross axle.

17. The positioning apparatus according to claim 7, wherein the loading portion comprises a fixing board engaged with the cross axle.

\* \* \* \* \*